(12) United States Patent
Shun'ko

(10) Patent No.: US 6,392,351 B1
(45) Date of Patent: May 21, 2002

(54) INDUCTIVE RF PLASMA SOURCE WITH EXTERNAL DISCHARGE BRIDGE

(76) Inventor: Evgeny V. Shun'ko, 735 Loretta St., Pittsburgh, PA (US) 15217

(*) Notice: Subject to any disclaimer, the term of this patent is extended or adjusted under 35 U.S.C. 154(b) by 0 days.

(21) Appl. No.: 09/303,928

(22) Filed: May 3, 1999

(51) Int. Cl.$^7$ ................................................ H01L 21/00

(52) U.S. Cl. .............................. 315/111.51; 315/115.51; 118/723 I; 118/723 R; 118/723 AN

(58) Field of Search ....................... 315/111.21, 111.51, 315/111.81; 156/345; 118/723 AN, 723 MW, 723 I, 723 R

(56) References Cited

U.S. PATENT DOCUMENTS 5,290,382 A * 3/1994 Zarowin et al. ............ 156/345

OTHER PUBLICATIONS

Industrial Plasma Engineering, vol. 1, Principles, by T. Roth, Institute of Physics Publishing, 1995.

Review of Inductively Coupled Plasmas for Plasma Processing by T. Hopwood—Plasma Sources Science and Technology, pp. 1–109, 1992.

* cited by examiner

Primary Examiner—Michael B Shingleton

(57) ABSTRACT

An RF ICP source having a housing with a flanged cover. The interior of the housing serves for confining plasma generated by the plasma source. The cover has at least two openings which are connected by a hollow C-shaped bridge portion which is located outside the housing. The hollow C-shaped bridge portion is embraced by an annular ferrite core having a winding connected to an electric power supply source for generating a discharge current which flows through the bridge portion and through the interior of the housing. The discharge current is sufficient for inducing plasma in the interior of the housing which is supplied with a gaseous working medium. The power source operates on a relatively low frequency of 60 KHz or higher and has a power from several watt to several kilowatt. In order to provide a uniform plasma distribution and uniform plasma treatment, the cover may support a plurality of bridges. Individual control of the inductors on each bridge allows for plasma redistributing. The housing of the working chamber can be divided into two section for simultaneous treatment of two objects such as semiconductor substrates. A plate that divides the working chamber into two sections may have ferrite cores built into the plate around the bridges. In another embodiment, the flow of gaseous working medium is supplied via a tube connected to the bridge portion of the source.

17 Claims, 9 Drawing Sheets

INDUCTIVE RF PLASMA SOURCE WITH EXTERNAL DISCHARGE BRIDGE

FIELD OF INVENTION

The present invention relates to a plasma processing technology, in particular to an RF inductive coupled plasma source with an external discharge bridge.

BACKGROUND OF THE INVENTION

Plasma is highly ionized gas containing an equal number of positive ions and electrons.

At the present time plasma sources find wide applications in various fields of technology, in particular in the manufacture of semiconductor devices, e.g., for cleaning, etching, deposition, etc., in the production of semiconductor chips.

There exist a great variety of plasma sources which differ in the methods of plasma excitation and the geometry of the electrodes and plasma volume, which, in turn, determine major parameters of the plasma. One type of plasma sources of this type which exists within this variety is known as an inductive coupled plasma. The plasma source of this type is excited by electromagnetic fields having frequencies within the range of few MHz to tens of MHz (RF frequencies).

RF inductive coupled plasma sources (hereinafter referred to as RF ICP sources) find wide industrial application in plasma processing technology. An advantageous feature of RF ICP sources is that electromagnetic energy can be delivered without the requirement for electrodes to be in contact with the plasma. The presence of electrodes can be a serious disadvantage in many applications because the electrodes may generate impurities in plasma volume and transfer them to the final product. The present invention relates specifically to the aforementioned RF ICP source. Such ion sources are described, e.g., by M. A. Lieberman and A. J. Lichtenberg in "Principles of Plasma Discharges and Materials Processing", John Wiley and Sons, Inc., N.Y., 1994, p. 387. Typical RF ICP sources of the last generation are described also in: "Industrial Plasma Engineering", Vol. 1, Principles, by J. Reece Roth, Institute of Physics Publishing, 1995. As shown in Fig. 11.16, page 413 of this book (see FIG. 1 of the present patent application), an RF ICP source 10 is geometrically similar to DC and RF capacitive hollow cylindrical reactors. A workpiece 12 to be treated, e.g., a semiconductor wafer, is placed into the working chamber 14 of the RF ICP source 10, onto its bottom plate 16. A flat spiral inductive coil 18 which is used for the supply of an RF power from an electric power supply source 17 to the reactor for generation of plasma in the working chamber 14 of the RF ICP source 10 is placed onto the upper surface 20 of the source. The working chamber 14 of RF ICP source 10 contains multipolar permanent magnets (not shown) the purpose of which is to generate a magnetic field around the plasma. This magnetic field improves plasma uniformity, plasma confinement, and increases density of the plasma which in this source may reach $10^{18}$ electrons/m$^{-3}$.

A gaseous working medium required for a specific process is fed to the working chamber 14 of the RF ICP source 10 under the pressure of about 1 to 20 mTorr, whereby, at the supply of RF power to the flat spiral inductive coil 18 at a frequency of 1 to 40 MHz, plasma is generated inside the working chamber 14 of the source above and in contact with the workpiece 12. As a result, depending on the type of the working medium, the workpiece is subjected to treatment such as cleaning, etching, coating, etc.

However, for a typical RF ICP source of the type described above, the resonant RF current of the coil 18 should be of about few tens of Amperes, and the RF voltage across the inductor coil 18 reaches few kV. Under such conditions, the RF power loss in a matcher, connectors, and the coil 18 itself, due to the final RF resistance in these elements, is comparable to that transferred to the plasma. Moreover, due to the coil and metal proximity, an essential RF current is induced along the walls of the chamber 14. This means that the power transfer efficiency to the plasma in practical ICP devices is essentially less than 1, and considerable power is dissipated in the ICP hardware.

The ICP source is normally provided with a quartz window. The large RF voltage across the inductor coil 18 (few kV) in ICP sources creates a considerable capacitive current through plasma to the chamber walls and a high DC negative potential on the inner surface of the quartz window. This high DC potential accelerates plasma ions to the window causing its erosion and plasma contamination. Furthermore, the capacitive RF current increases the plasma DC potential to the chamber 14, thus limiting (from the bottom) the minimal energy of ions coming to the substrate 12. This is an undesirable feature too, since energetic ions can damage the substrate 12. Generally, the presence of high RF voltages on the coil 18 and on the matching device causes a lot of problems (such as corona discharge, sparking, and breakdown), and the elimination of these problems takes a significant and costly efforts.

Another common drawback of existing industrial plasma sources using inductive, capacitive and microwave plasma discharge is utilization of relatively high RF frequency (usually 13.56 MHz or higher, up to microwave frequency). This results in expensive, low-efficiency and bulky RF power sources, expensive RF or microwave components in feeders and matching devices, and requires considerable shielding of the RF components bearing high RF voltage and current, to prevent electromagnetic interference with nearby electronic equipment.

An ICP source with reduced frequency and reduced RF voltage was disclosed in pending U.S. patent application Ser. No. 55,452 filed in 1998 by the same applicant. FIG. 2 illustrates a plasma source 36 made in accordance with one embodiment of the aforementioned patent application. This device consists of a sealed working chamber 38, made of such a material as aluminum, fused quartz, ceramic, or the like, which contains an annular transformer magnetic core 40 with a primary winding 42. The core 40 and primary winding 42 are surrounded by a cooling jacket 44 for the supply of a coolant which is fed into the jacket 44 via a coolant inlet pipe 46 and is discharged via a coolant outlet pipe 48. Reference numeral 50 designates a generator. The cooling system protects the core 40 and winding 42 from overheating and thus from variation in the magnetic susceptibility of the ferrite core 40. The plasma is generated in the chamber having a bottom 51 which supports an object to be treated, e.g., a semiconductor wafer 52.

A main disadvantage of such a device is the need in the supply of a cooling agent to the inductor and chamber and problems associated with sealing the coolant from the vacuum. A device made in accordance with still another embodiment of U.S. patent application Ser. No. 55,452 maintains plasma inside a closed metal tube with dielectric seals. The plasma is confined inside the tubes and therefore is applicable only for processes which occur inside the plasma volume, e.g., for plasma synthesis or plasma abatement. Without free plasma surface, for majority of applications in plasma processing of surfaces and in ion sources, the device of this embodiment is not effective.

OBJECTS OF THE INVENTION

It is an object of the present invention to provide an inductive RF plasma source with external discharge bridge which is simple in construction, inexpensive to manufacture, is free of the induction of essential RF currents along the walls of the working chamber, has a high power transfer efficiency to the plasma, is free of dissipation of power in the ICP hardware, provides direct contact of plasma surface with the object being treated, prevents damaging of the structural elements of the source with the plasma, provides uniform plasma surface, and makes it possible to increase the efficiency of plasma processing. Another object of the invention is to provide efficient generation of plasma in a wide range of pressures of working medium in the plasma source.

BRIEF DESCRIPTION OF THE DRAWINGS

FIG. 4 shows an arrangement of six bridges and FIG. 5 shows an arrangement of eleven bridges.

SUMMARY OF THE INVENTION

An RF ICP source having a housing with a flanged cover. The interior of the housing serves for confining plasma generated by the plasma source. The cover has at least two openings which are connected by a hollow C-shaped bridge portion which is located outside the housing. The hollow C-shaped bridge portion is embraced by a ferrite core having a winding connected to an electric power supply source for generating a discharge current which flows through the bridge portion and through the interior of the housing. The discharge current is sufficient for inducing plasma in the interior of the housing which is supplied with a gaseous working medium. The power source operates on a relatively low frequency of 60 KHz or higher and has a power from several W to several kW. In order to provide a uniform plasma distribution and uniform plasma treatment, the cover may support a plurality of bridges. Individual control of the inductors on each bridge allows for plasma redistribution. The housing of the working chamber can be divided into two sections for simultaneous treatment of two objects such as semiconductor substrates. In another embodiment, the efficiency of generation of plasma inside the chamber is improved by supplying the flow of the gaseous working medium via a bridge portion of the inductor.

DETAILED DESCRIPTION OF THE PLASMA SOURCE OF THE PRESENT INVENTION

Figure 1:
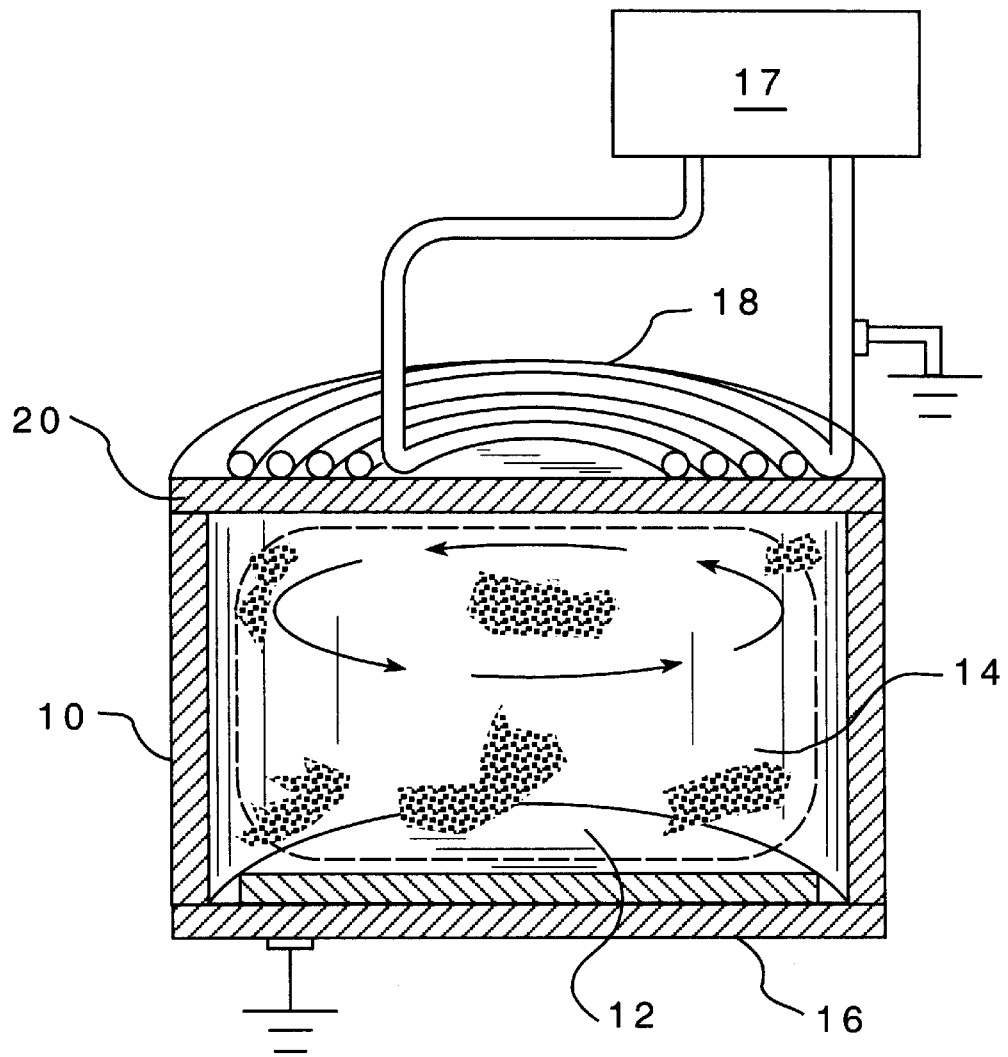
FIG. 1 is a schematic view of a known RF ICP source with a spiral inductive coil on the cover of the working chamber.
Figure 2:
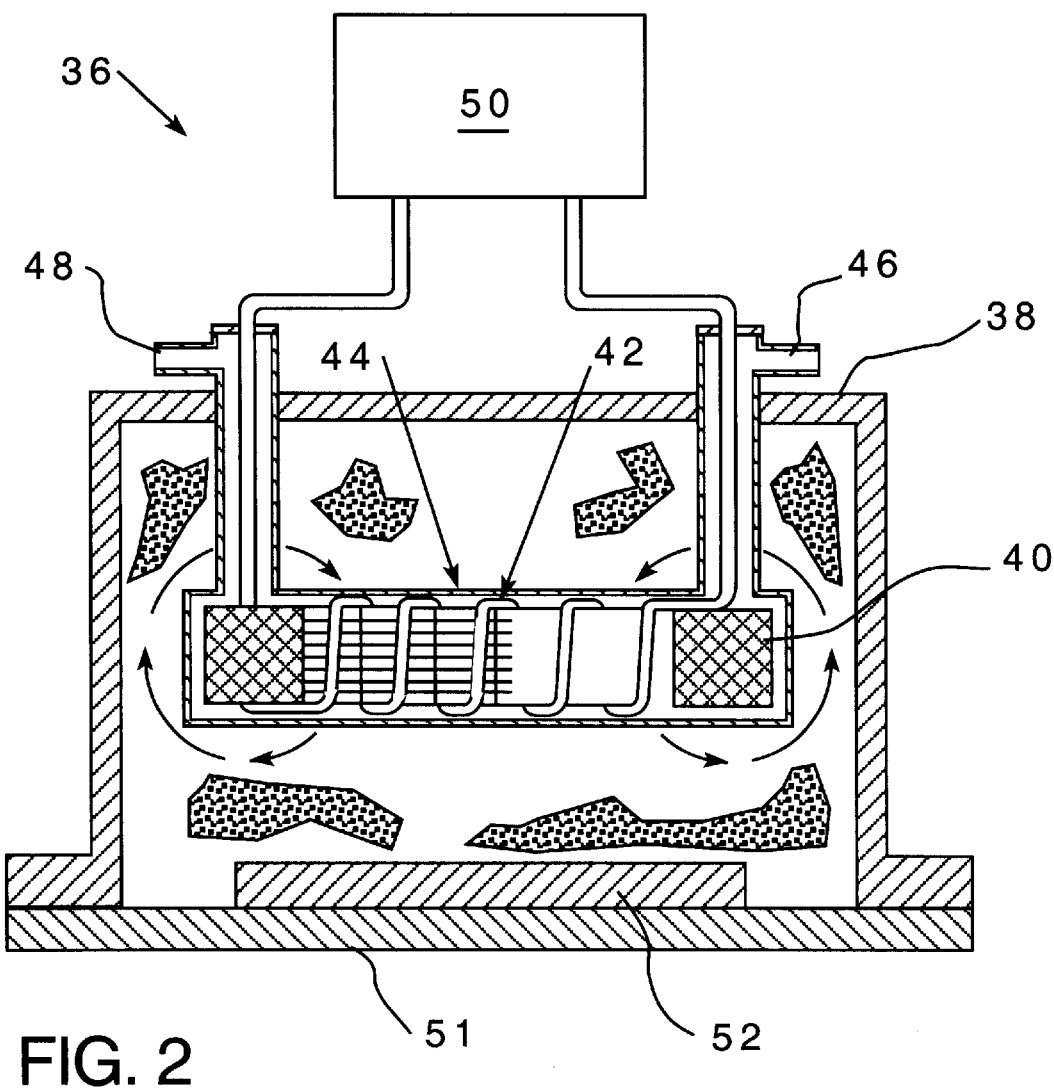
FIG. 2 is a schematic side sectional view of an RF ICP source with an inductor located inside the working chamber and equipped with a cooling system.
Figure 3:
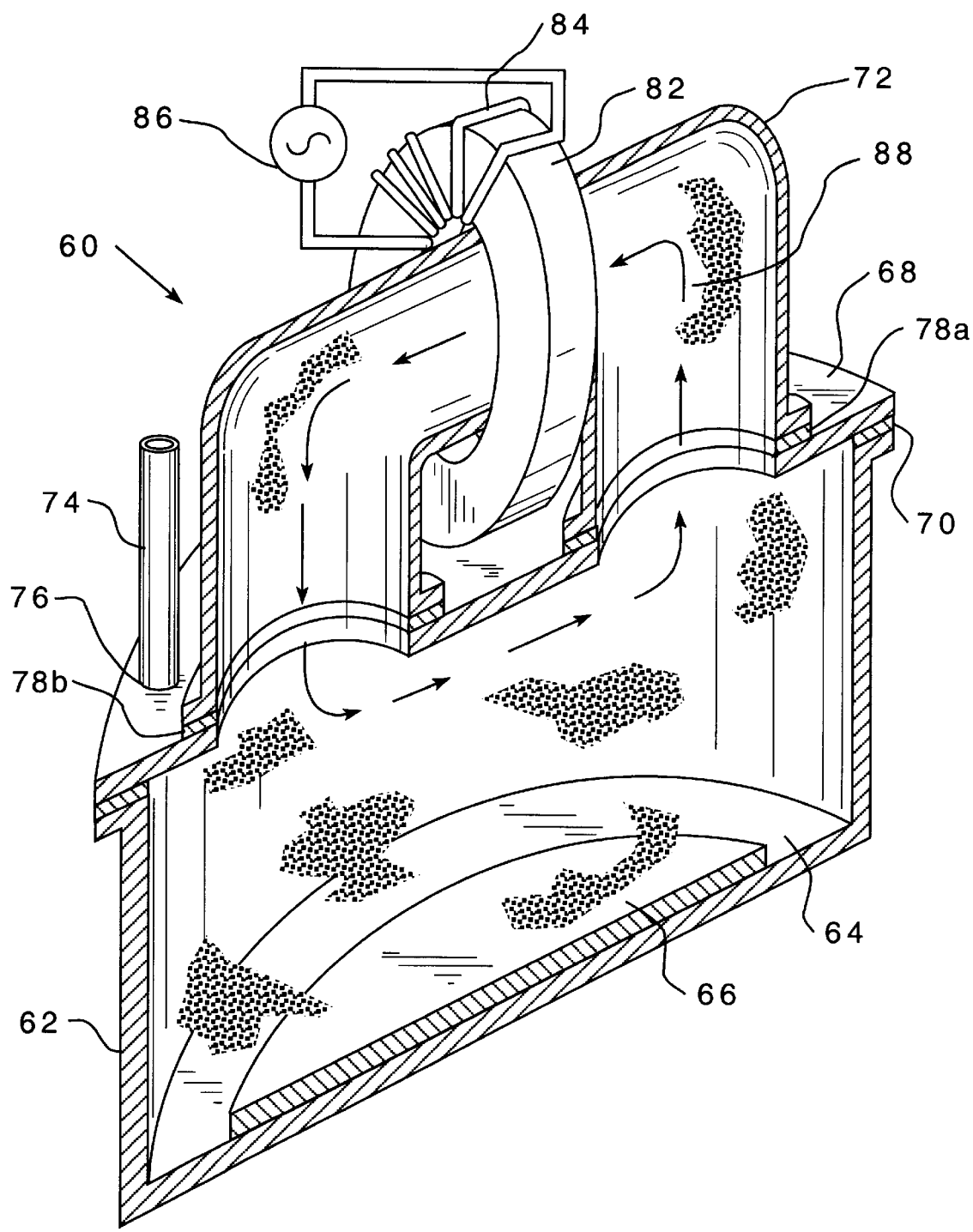
FIG. 3 is a three-dimensional sectional view of a plasma source of the present invention with plasma-generating bridges.

An RF plasma source 60 made according to one embodiment of the present invention is shown in FIG. 3 which is a three-dimensional sectional side view of the device. The device comprises a sealed cylindrical housing 62 with a bottom plate 64 for placing an object to be treated, e.g., a substrate 66 to be plasma processed, and a flanged cover 68. The housing 62 is sealed with an O-ring seal 70. The flanged cover 68 has a by-pass or bridge C-shaped portion 72 which extends upward, i.e., away from the working chamber or housing 62. A gaseous working medium is supplied into the housing 62 by a gas supply tube 74 via an opening 76 in the flanged cover 68. The bridge portion 72 is vacuum sealed against flanged cover 68 by ring-shaped seals 78a and 78b. The bridge portion 72 is surrounded by a ferrite ring-shaped transformer core 82 having a primary winding 84 connected to an RF power source 86. Ferrite core 82 induces an electromotive force (discharge voltage) inside bridge portion 72 As shown in FIG. 3, the discharge path 88 of this electromotive force passes through the bridge portion 72 and the upper part of working chamber 62. To prevent the electrical shortening of the discharge current inside the bridge portion 72 and the working chamber, the bridge portion 72 or the flanged cover 68 should have no conductivity in the direction of the discharge path 88. This is done by making the bridge portion 72 of a non-conductive material such as glass, quartz or ceramic. Another way of achieving the above objective is to make connection between the conductive bridge 72 and the cover 68 with non-conductive seals 78a and 78b.

During the operation, a gaseous working medium is supplied to the working chamber 62 via supply pipe 74, the voltage is applied to the primary winding 84 of the inductor formed of the winding 84 and the ferrite core 82, and the electromotive force is generated along the path 88 which passes through the hollow bridge portion 72 and the upper part of the working chamber 62. As a result, a plasma (not shown) is generated inside the working chamber 62 above the substrate 66, whereby the substrate 66 is subjected to plasma processing. For a relatively low gas pressure (e.g., 1 to 100 mTorr), the plasma density distribution with the working chamber 62 has a smoothed structure defined by the chamber inner surfaces rather than by the discharge current path distribution.

Figure 3A:
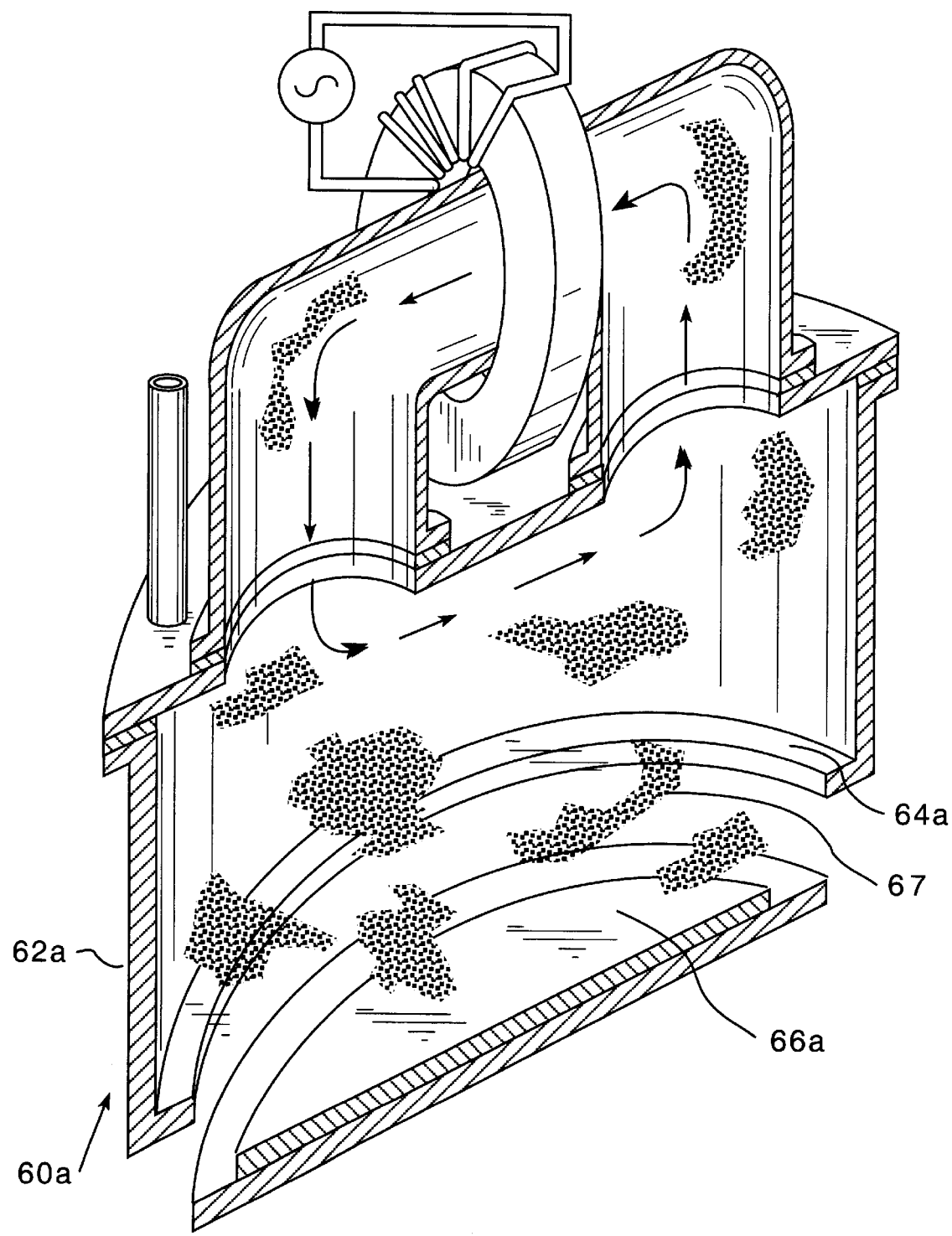
FIG. 3A is the plasma source of the type shown in FIG. 3 with an open bottom for creating a plasma surfaces for treating externally located objects.

FIG. 3A is the plasma source 60a of the type shown in FIG. 3 with an open bottom for creating a plasma surface for treating externally located objects or for the extraction of ions. This plasma source differs from the one shown in FIG. 3 in that its bottom part 64a has an opening 67 for exposing an externally-located object 66a to the plasma surface of the plasma generated in the housing 62a. This allows for treating objects of large surface area or to install an ion-extracting device.

Figure 4:
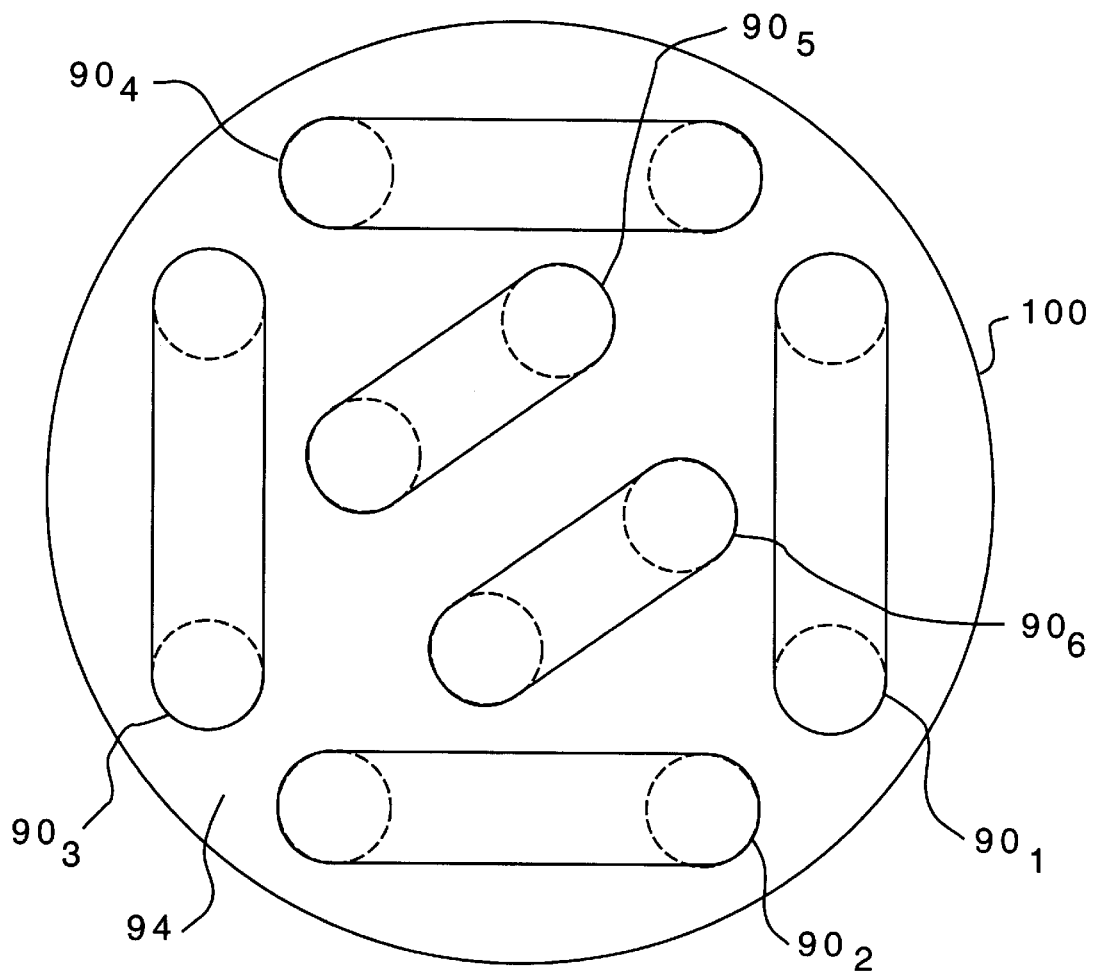
FIG. 4 and FIG. 5 are top views of an RF ICP sources of the present invention with a plurality of bridges used for improving plasma homogeneity on the chamber bottom.
Figure 5:
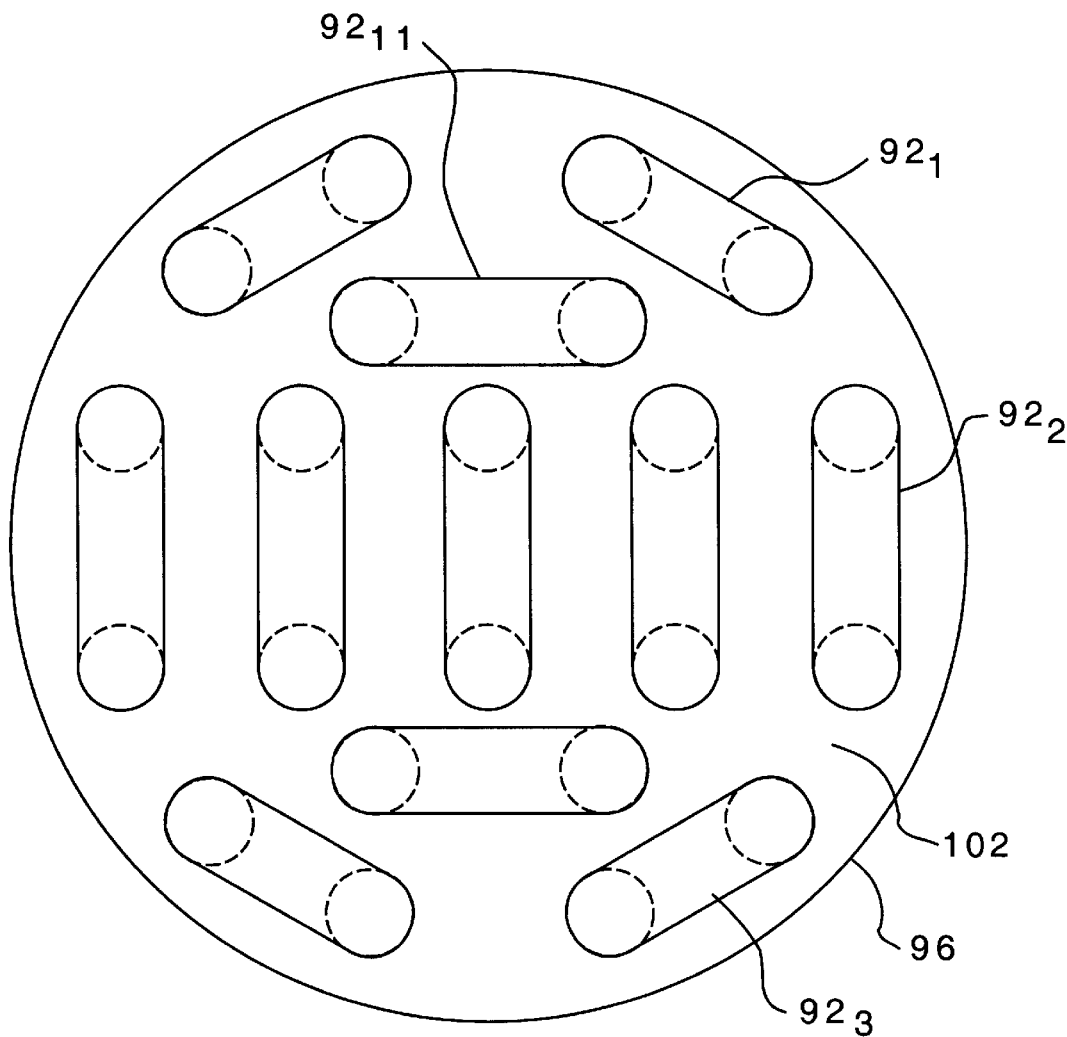

FIG. 4 and FIG. 5 are top views of RF ICP source of the present invention with a plurality of bridges used for improving plasma homogeneity on the chamber bottom 64 and, hence on the surface of the substrate 66 (the inductors are not shown for simplicity of the drawings). FIG. 4 shows an arrangement of six bridges 901 to 906, and FIG. 5 shows an arrangement of eleven bridges 921 to 9214. In these embodiments each opening in the cover 100 or 102 (two openings for each bridge) works as a separate plasma source. The multiplicity of such sources provides homogeneous plasma distribution over the cross-section of the working chambers 94 and 96, respectively (FIGS. 4 and 5). On the other hand, independent energizing of separate bridges allows for effective control of the plasma redistribution.

Figure 6:
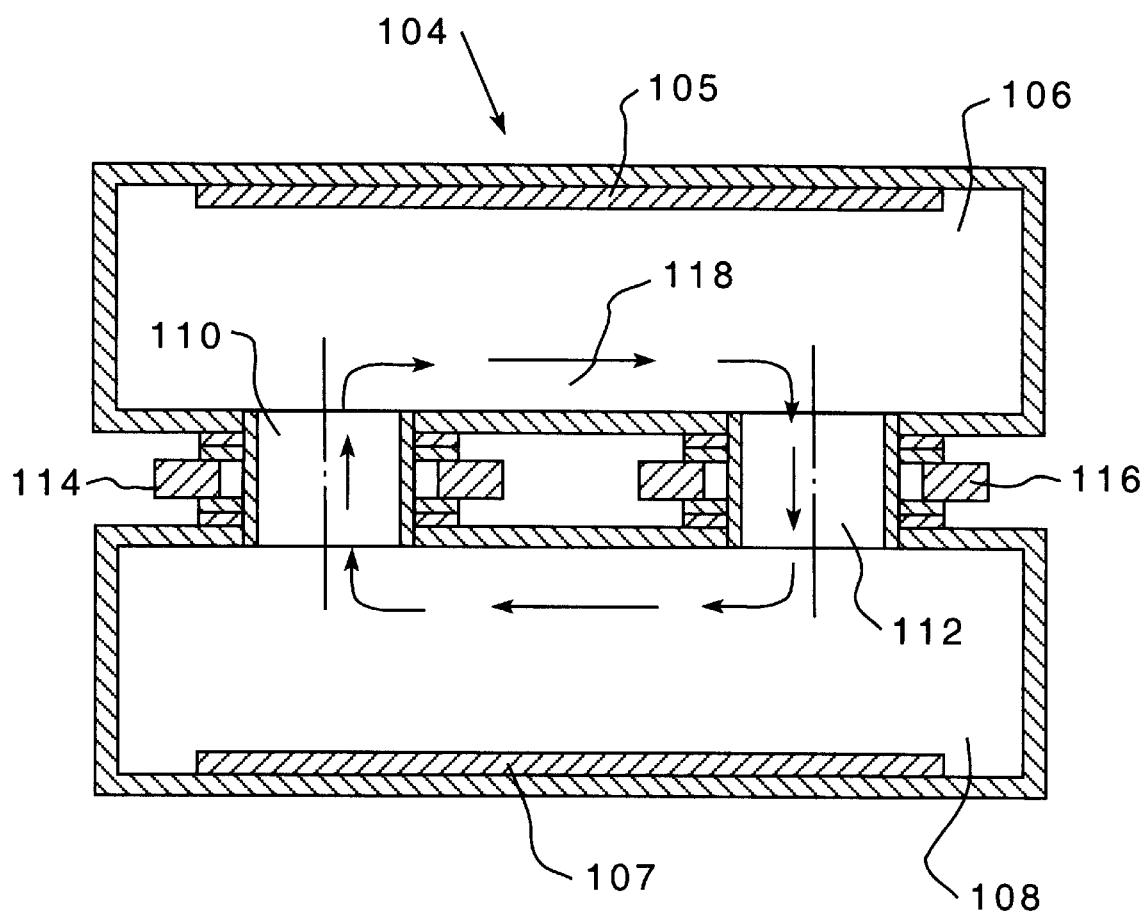
FIG. 6 is a top sectional view of an RF ICP source with a doubled working chamber for simultaneous processing of two objects.

FIG. 6 is a top sectional view of an RF ICP source 104 made in accordance with another embodiment of the invention which is aimed at an increased productivity of plasma processing. This objective is achieved by dividing the working chamber of the plasma source 104 into two sections 106 and 108 which are interconnected via a plurality of bridges. Two short bridges 110 and 112 are shown in the embodiment of FIG. 6. The bridges are embraced by respective annular ferrite cores 114 and 116 which generate an electromotive force 118. The closed-loop path of the electromotive force passes from one section of the working chamber to another via bridges 110 and 112.

Two objects 105 and 107 to be treated are placed on opposite plasma-facing sides of the working chambers 106 and 108. Such an arrangement makes it possible to double the productive efficiency of the plasma source. The large number of bridges can provide a uniform plasma density distribution in front of each object being treated.

Figure 6A:
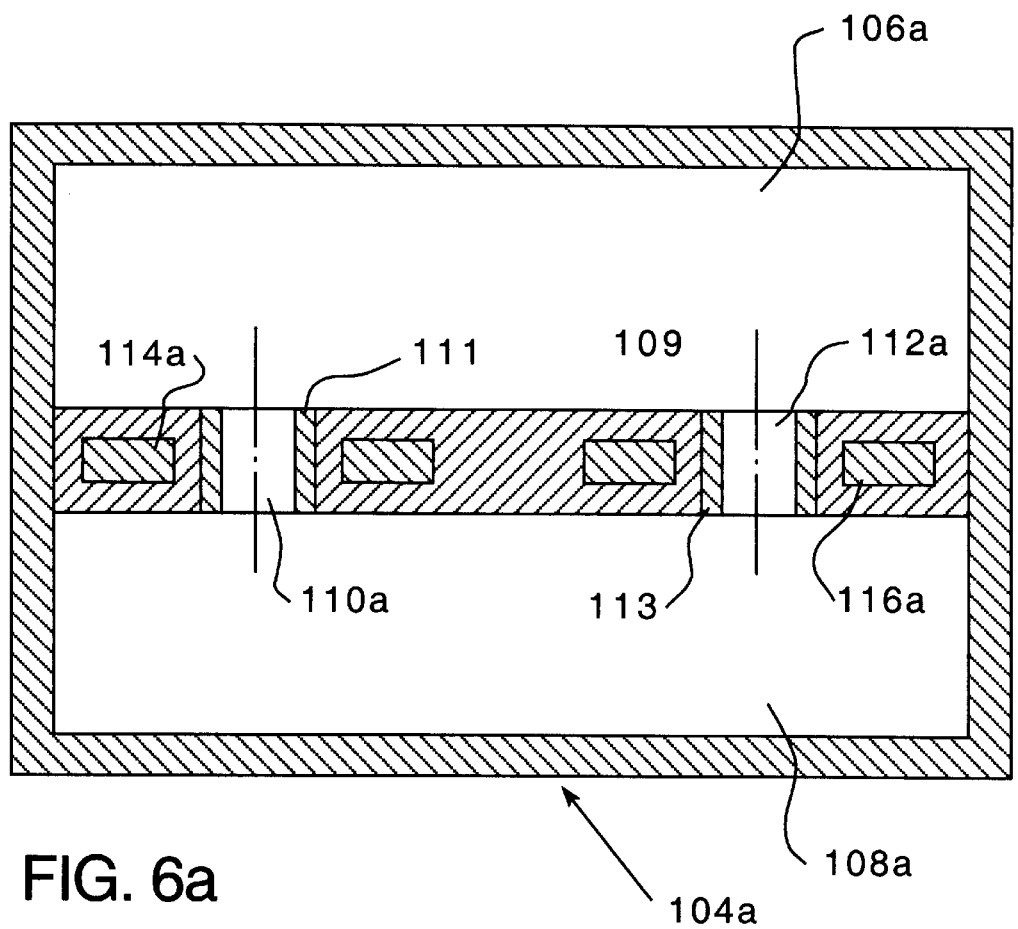
FIG. 6A is a top sectional view of an RF ICP source with a working chamber divided into two sections by a plate with built-in induction coils.

FIG. 6A illustrates another embodiment of the invention which is similar to the one shown in FIG. 6. However, in this case the working chamber of a plasma source 104a is divided into the sections 106a and 108a by a plate 109 with two (or more) short bridges 110a and 112a formed by quartz tubes 111 and 113. Two ferrite cores 114a and 116a with windings (not shown) are built into the material of plate 109 around quartz tubes 111 and 113.

Figure 7:
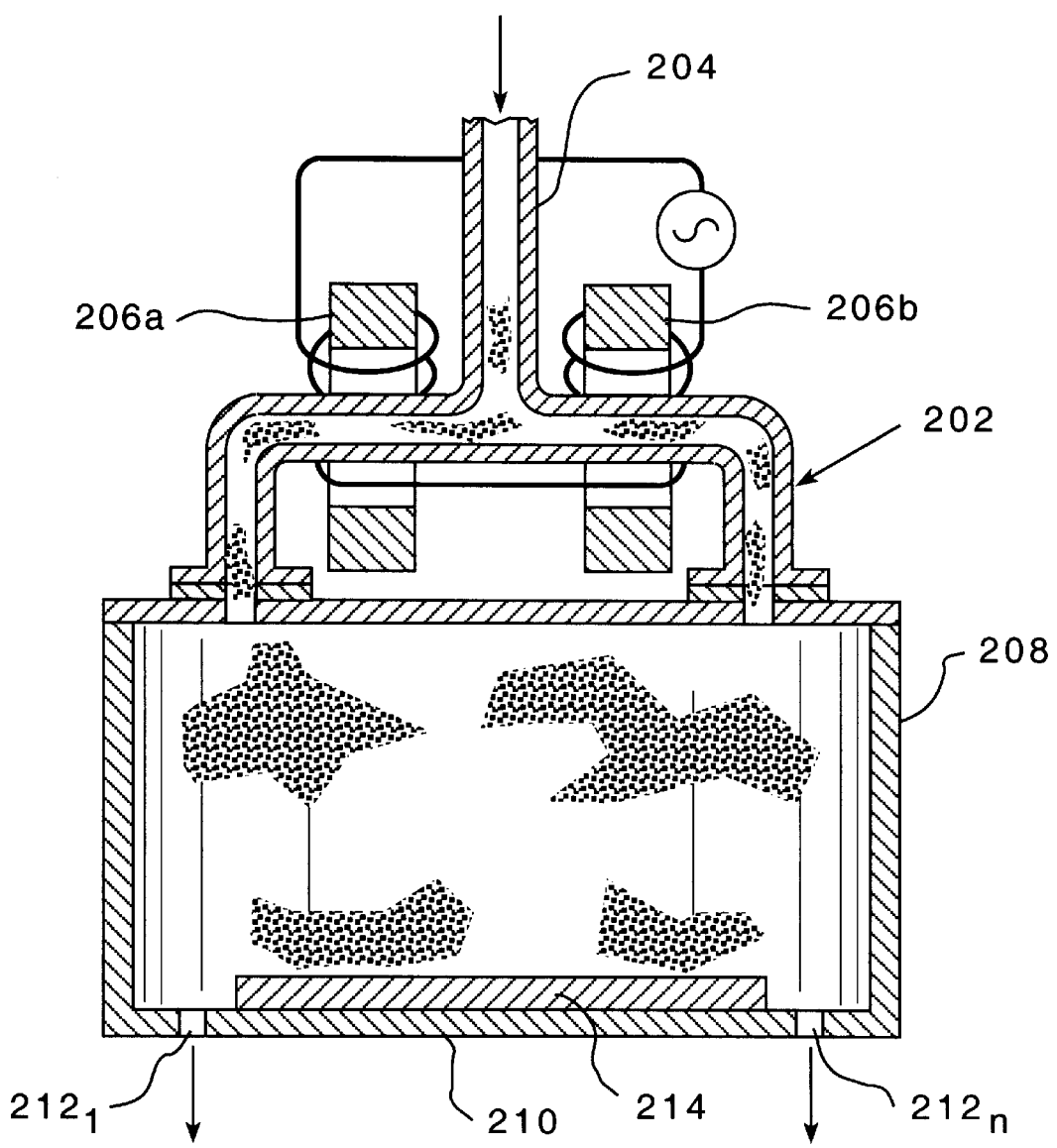
FIG. 7 is a schematic sectional view of an RF ICP source with a supply of working medium via a bridge portion of the plasma inductor.

FIG. 7 is a schematic sectional view of an RF ICP source 200 with a supply of working medium via a bridge portion of the plasma inductor. As shown in FIG. 7, RF ICP source 200 is similar to source 60 and differs from it in that the working medium is supplied into the source via a bridge C-shaped portion 202. For this purpose, a gas supply tube 204 is connected to the central part of bridge portion 202. Since the central part of bridge portion 202 is occupied by gas supply tube 204, an inductor coil may be divided into two parts 206a and 206b which are arranged symmetrically on both side of gas supply tube 204. In order to ensure uniform distribution and discharge of gaseous medium in and from a working chamber 208 of the source, a bottom portion 210 of the chamber 208 has a plurality of openings $212_1 \ldots 212_n$ uniformly arranged around an object 214 being treated.

The supply of gaseous working medium via the bridge portion make it possible to improve the efficiency of generation of plasma inside working chamber 208. This is because, due to the gas flow, the pressure of the working gas in the bridge is higher than in the chamber. This generates a high plasma density in the bridge and, hence, near the surface of the object being treated. Furthermore, since the plasma is not exposed to RF voltage, it is free of such problems as sputtering and contamination.

Thus it has been shown that the invention provides an inductive RF plasma source with external discharge bridge which is simple in construction, inexpensive to manufacture, has relatively high power with low RF power loss, is free of the induction of essential RF currents along the walls of the working chamber, has a high power transfer efficiency to the plasma, provides direct contact of plasma surface with the object being treated, prevents damaging of the structural elements of the source with the plasma, provides uniform plasma surface, and makes it possible to increase the efficiency of plasma processing. The plasma source of the invention does not need a matching device and allows for utilization of low frequency.

Although the invention has been shown in the form of a specific embodiments, it is understood that these embodiments were given only as examples and that any changes and modifications are possible, provided they do not depart from the scope of the appended claims. For example, the working chambers may have cross-sectional configurations other than circular or rectangular, the number of bridges may be different from those shown in the drawings, the bridge shown in FIG. 3 can be made from a non-conductive material integrally with the housing 62, several independently energized ferrite cores can be placed around a single elongated bridge. To improve the device efficiency, the bridge and/or plasma chamber may utilize a multipole or a solenoidal magnetic field for better plasma confinement.

What I claim is:

1. A radio-frequency inductive coupled plasma source comprising:

a housing having a cover, the interior of said housing serving for confining plasma generated by said plasma source;

at least two openings in said cover;

at least one a hollow C-shaped bridge portion which connects said at least two openings and is located outside said housing;

at least one ferrite core which embraces said hollow C-shaped bridge portion, said ferrite core having a winding connected to an electric power supply source for generating an electromotive force which excites plasma in said hollow C-shaped bridge portion and in said interior of said housing; and means for the supply of a gaseous working medium into said interior of said housing.

2. The plasma source of claim 1, wherein said housing has a closed bottom portion so that said interior is sealed and evacuated, said bottom portion serving to support an object to be processed by said plasma.

3. The plasma source of claim 1, wherein said at least one bridge portion is made of a non-conductive material.

4. The plasma source of claim 1, wherein said cover is made of a non-conductive material, and said bridge is made of a conductive material.

5. The plasma source of claim 3, wherein said housing and cover are made of a conductive material, and said bridge is made of a conductive material and is electrically isolated from said cover.

6. The plasma source of claim 1, wherein said cover supports a plurality of said hollow bridge portions uniformly distributed over said cover.

7. The plasma source of claim 6, wherein said housing has a bottom portion so that said interior is sealed and evacuated, said bottom portion serving to support an object to be processed by said plasma.

8. The plasma source of claim 7, said housing is made of a non-conductive material.

9. The plasma source of claim 8, wherein said housing is made of a conductive material, and said cover is made of a non-conductive material.

10. The plasma source of claim 1, wherein said housing is made of a non-conductive material and said cover is made of a conductive material.

11. The plasma source of claim 6, wherein said housing has a bottom with an opening for exposing an external object to be treated to the surface of said plasma.

12. The plasma source of claim 1, wherein said housing is separated into two sections interconnected by at least two bridges, the path of said electromotive force passing through said two bridges and through both said sections so that plasma is generated in both said two sections simultaneously for treating two objects.

13. The plasma source of claim 1, wherein said housing is separated into two sections interconnected by at least two bridges, said plate having ferrite cores built into said plate around said bridges.

14. The plasma source of claim 13, wherein said housing has a bottom with an opening for exposing an external object to be treated to the surface of said plasma.

15. The plasma source of claim 13, wherein said housing has a bottom portion so that said interior is sealed and evacuated, said objects being located in said sections in positions facing said plasma.

16. The plasma source of claim 1, wherein said means for the supply of a gaseous working medium is connected with said hollow C-shaped bridge portion via a working medium supply tube.

17. The plasma source of claim 16, wherein said ferrite core consists of two parts which are symmetrically arranged on both sides of said working medium supply tube.

* * * * *